United States Patent
Huang et al.

(10) Patent No.: US 9,659,672 B2
(45) Date of Patent: *May 23, 2017

(54) MEMORY DEVICE INCLUDES EFUSE, AND METHODS FOR READING AND OPERATING THE SAME

(71) Applicant: Semiconductor Manufacturing International (Shanghai) Corporation, Shanghai (CN)

(72) Inventors: Chen-Yi Huang, Shanghai (CN); Jiaqi Yang, Shanghai (CN); Cheng-Tai Huang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/809,615

(22) Filed: Jul. 27, 2015

(65) Prior Publication Data
US 2016/0035439 A1    Feb. 4, 2016

(30) Foreign Application Priority Data

Jul. 30, 2014  (CN) .......................... 2014 1 0369901

(51) Int. Cl.
*G11C 17/00*    (2006.01)
*G11C 29/00*    (2006.01)
*G11C 17/16*    (2006.01)
*G11C 17/18*    (2006.01)

(52) U.S. Cl.
CPC ............ *G11C 29/787* (2013.01); *G11C 17/16* (2013.01); *G11C 17/18* (2013.01)

(58) Field of Classification Search
CPC ..... G11C 29/808; G11C 17/16; G11C 29/787; G11C 17/165; G11C 17/18; G11C 29/027
USPC ........................... 365/96, 200, 201, 205, 207
See application file for complete search history.

(56) References Cited

U.S. PATENT DOCUMENTS

| 5,910,916 | A  | * | 6/1999 | Akaogi | ................ | G11C 16/08 257/E21.688 |
| 8,400,860 | B2 | * | 3/2013 | Lin    | ................ | G11C 17/16 365/225.7 |
| 8,411,482 | B2 | * | 4/2013 | Chen   | ................ | G11C 17/18 365/225.7 |
| 8,482,989 | B2 | * | 7/2013 | Son    | ................ | G11C 17/14 365/189.02 |

OTHER PUBLICATIONS

U.S. Appl. No. 14/809,724.*

* cited by examiner

*Primary Examiner* — David Lam
(74) *Attorney, Agent, or Firm* — Anova Law Group, PLLC (57) ABSTRACT

The present disclosure provides a memory. The memory includes an array of memory cells arranged as a plurality of rows by a plurality of columns. A memory cell is connected to at least one redundant memory cell in series in a same row for storing same data as the memory cell; and a column of memory cells correspond to at least one redundant column of redundant memory cells wherein each redundant memory cell in the at least one redundant column stores same data as the memory cell in a same row.

7 Claims, 8 Drawing Sheets

MEMORY DEVICE INCLUDES EFUSE, AND METHODS FOR READING AND OPERATING THE SAME

CROSS-REFERENCES TO RELATED APPLICATIONS

This application claims the priority of Chinese patent application No. CN201410369901.8, filed on Jul. 30, 2014, the entire contents of which are incorporated herein by reference.

FIELD OF THE INVENTION

The present invention relates to the field of semiconductor manufacturing technology and, more particularly, relates to a memory array and memory device, and methods for reading and operating the same.

BACKGROUND

The development of efuse technology is based on the characteristics of polysilicon fuse. The initial resistance of an efuse is considerably small, but when a high current flows through the efuse, the efuse may be melted and the resistance multiplies. Therefore, the value of the data programmed to an efuse memory cell may be reflected by whether the efuse is melted.

Figure 1:
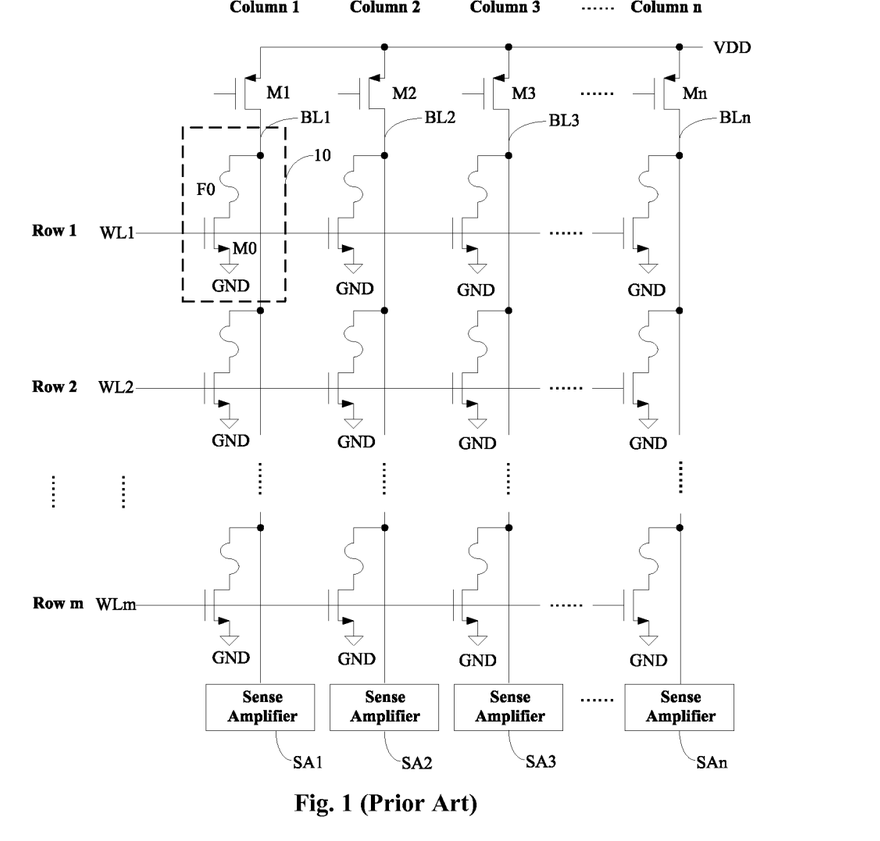
FIG. 1 illustrates an existing memory device.

As shown in FIG. 1, an existing efuse memory circuit often includes m wordlines, n column-select transistors, n bitlines, n sense amplifiers (SAs), and an efuse memory array, where m and n are positive integers.

The m wordlines include: a first wordline WL1, a second wordline WL2, . . . , and an $m^{th}$ wordline WLm. The n column-select transistors include: a first column-select transistor M1, a second column-select transistor M2, a third column-select transistor M3, . . . , and an $n^{th}$ column-select transistor Mn. Each source of a column-select transistor is connected to the power supply voltage VDD.

The n bitlines include: a first bitline BL1, a second bitline BL2, a third bitline BL3, . . . , and an $n^{th}$ bitline BLn. Each one of the n bitlines is connected to the drain of the corresponding column-select transistor in the n column-select transistors.

The n sense amplifiers include: a first sense amplifier SA1, a second sense amplifier SA2, a third sense amplifier SA3, . . . , and an $n^{th}$ sense amplifier SAn. Each sense amplifier is connected to the corresponding bitline in the n bitlines.

That is, an efuse memory array may include an array of m (row)-by-n (column) memory cells. Each one of the m wordlines corresponds to one of the m rows of memory cells; each one of the n bitlines corresponds to one of the n columns of memory cells; and each memory cell corresponds to one wordline and one bitline.

Each memory cell includes a row-select transistor and an efuse. The gate of the row-select transistor is connected to the wordline corresponding to the memory cell, and the drain of the row-select transistor is connected to the first terminal of the efuse. The source of the row-select transistor is grounded (GND), and the second terminal of the efuse is connected to the bitline corresponding to the memory cell. For example, the memory cell 10 at (row 1, column 1) corresponds to the first wordline WL1 and the first bitline BL1. Memory cell 10 includes a row-select transistor M0 and an efuse F0. Of the row-select transistor M0, the gate is connected to the first wordline WL1, the drain is connected to the first terminal of the efuse F0, and the source is grounded. The second terminal of the efuse F0 is connected to the first bitline BL1.

The ON/OFF state of the a column-select transistor is controlled by applying a gate voltage on the column-select transistor, and the ON/OFF state of row-select transistors in a same row may be controlled by applying a voltage on the corresponding wordline. When the row-select transistor of a memory cell and the column-select transistor corresponding to the memory cell are both on, the efuse of the memory cell will be melted. The operation of melting an efuse is referred as a "write" operation to the memory cell. Whether an efuse is melted may be detected by testing the resistance of the efuse. When the resistance is higher than a certain threshold value, the efuse is considered melted, otherwise the efuse is considered not melted (i.e., the write operation to the memory cell fails).

Since a memory cell may not be written again once the efuse of the memory cell is melted, a memory cell can only be written once. The data often needs to be written to the memory cell is "1". That is, the efuse of the memory cell needs to be melted when "1" is to be stored into the memory cell. When "0" is to be stored into a memory cell, the efuse of the memory cell does not need to be melted.

However, writing a memory cell may be susceptible to programming failure, often caused by failing to melt the efuse after a "write" operation to the memory cell. The programming failure can result in an error when storing data to the memory cell. The programming error may further lead to reading error and, consequentially, low manufacturing yield of the corresponding memory device.

Build-in self repair (BISR) technique has been widely used to repair memory arrays. Often, a reconfigurable BISR scheme, e.g., a redundant circuit, to provide redundancy such that when programming failures and/or reading errors occur, the memory array can still operate with desired accuracy. In existing efuse technology, when a writing failure occurs in a memory cell of a row/column, the memory cells of the entire row/column may often need to be replaced. Certain redundancy techniques require a large area on the memory array or corresponding chip for redundancy circuits. Manufacturing yield of the memory array is undesirably low.

BRIEF SUMMARY OF THE DISCLOSURE

The disclosed method and system are directed to solve the problem of, for example, low manufacturing yield and requirement on replacing the entire row or column when programming failure occurs that currently exists in memory device manufacturing, and other problems.

One aspect of the present disclosure provides a memory. The memory includes an array of memory cells arranged as a plurality of rows by a plurality of columns, wherein a memory cell is connected to at least one redundant memory cell in series in a same row for storing same data as the memory cell; and a column of memory cells correspond to at least one redundant column of redundant memory cells wherein each redundant memory cell in the at least one redundant column stores same data as the memory cell in a same row.

Another aspect of the present disclosure provides a memory device. The memory device includes the disclosed memory, a plurality of second MOS transistors, a plurality of sense amplifiers, and a plurality of third MOS transistors. A first terminal of the second MOS transistor is connected to an input terminal of a sense amplifier and the first terminals of memory cells in one column, and a first terminal of a $j^{th}$ second MOS transistor is connected to an input terminal of a $j^{th}$ sense amplifier and second terminals of memory cells in column ($2j-2$), wherein j is greater than 1; and a first terminal of a $k^{th}$ third MOS transistor is connected to second terminals of memory cells in column ($2k-1$), wherein k is an integer greater than 0.

Another aspect of the present disclosure provides a programming method for programming the disclosed memory device. The programming method includes forming a path connecting a memory cell, a second MOS transistor connected to the memory cell, and a third MOS transistor connected to the memory cell; and programming data to the memory cell.

Another aspect of the present disclosure provides a non-redundant reading method for the disclosed memory device. The memory device includes forming a path connecting a memory cell, a sense amplifier connected to the memory cell, and a third MOS transistor connected to the memory cell; and reading data from the memory cell.

Another aspect of the present disclosure provides an operation method for the disclosed memory device. The memory device includes selecting column (p+c) as a redundant column for column p; and programming data for column p to the redundant column p, wherein p is an integer greater than 0 and c is an integer greater than 0.

Another aspect of the present disclosure provides a redundant reading method for the disclosed memory device. The memory device includes forming a path connecting a memory cell in column p, corresponding redundant memory cells in redundant columns for column p, a second MOS transistor connected to column p, and a sense amplifier connected to a last column of the corresponding redundant columns for column p to read data, wherein p is an integer greater than 0, c is an odd integer greater than 0.

Another aspect of the present disclosure provides a redundant reading method for the disclosed memory device. The memory device includes forming a path connecting a memory cell to be read in column p, corresponding redundant memory cells in redundant columns for column p, a second MOS transistor connected to a last column of redundant columns for column p, and a sense amplifier connected to column p to read data, wherein p is an integer greater than 0, and c is an odd integer greater than 0.

Another aspect of the present disclosure provides a redundant reading method for the disclosed memory device. The memory device includes forming a path connecting a memory cell to be read in column p, redundant memory cells in redundant columns for column p, a third MOS transistor connected to a last column of redundant columns for column p, and a sense amplifier connected to column p to read data, wherein p is an integer greater than 0, and c is an even integer number.

Other aspects of the present disclosure may be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 2:
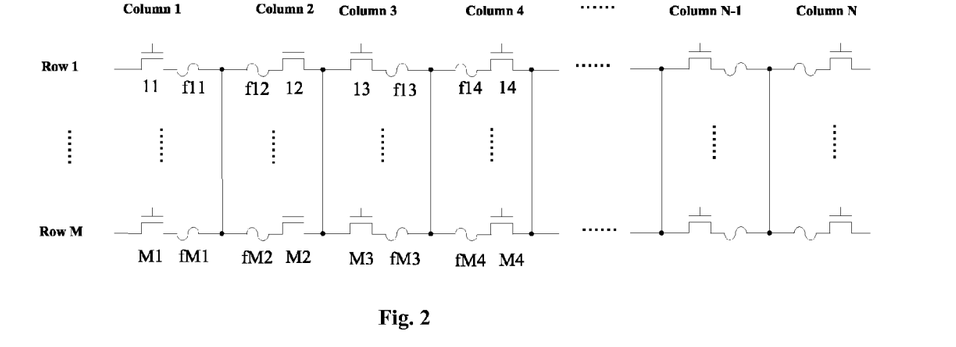
FIG. 2 illustrates an exemplary memory array consistent with the disclosed embodiments.

As shown in FIG. 2, the present disclosure provides a memory array. The memory array includes an array of M-by-N memory cells, where M≥1, N≥2. Each memory cell may include a first MOS transistor and an efuse. In one memory cell, the first terminal of the first MOS transistor may be connected to the first terminal of the efuse, one of the second terminal of first MOS transistor and the second terminal of the efuse may form the first terminal of the memory cell, and the other one of the second terminal of first MOS transistor and the second terminal of the efuse may form the second terminal of the memory cell. First terminal of each memory cell in one column may be connected, and second terminal of each memory cell in one column are connected. The first terminal of each memory cell of column n may be connected to the second terminal of each memory cell of column (n−1), where N≥n≥2.

Embodiments are now illustrated in detail. For illustrative purposes, in the disclosed embodiments, the first terminal of a memory cell in an odd numbered column may be the second terminal of the corresponding first MOS transistor, and the first terminal of a memory cell in an even-numbered column may be the second terminal of the corresponding efuse.

In one embodiment, the first terminal of the first MOS transistor may be the drain of the first MOS transistor, and the second terminal of the first MOS transistor may be the source of the first MOS transistor. Alternatively, the first terminal of the first MOS transistor may be the source of the first MOS transistor, and the second terminal of the first MOS transistor may be the drain of the first MOS transistor.

Memory cells from column 1 to column 4 of the memory array may be used to exemplify the disclosure. In the memory cell at (row 1, column 1), the first terminal of first MOS transistor 11 may be connected to the first terminal of efuse f11; in the memory cell at (row 1, column 2), the first terminal of first MOS transistor 12 may be connected to the first terminal of efuse f12; in the memory cell at (row 1, column 3), the first terminal of first MOS transistor 13 may be connected to the first terminal of efuse f13; in the memory cell at (row 1, column 4), the first terminal of first MOS transistor 14 may be connected to the first terminal of efuse f14; ..., and in the memory cell at (row M, column 1), the first terminal of first MOS transistor M1 may be connected to the first terminal of efuse fM1. In the memory cell at (row M, column 2), the first terminal of first MOS transistor M2 may be connected to the first terminal of efuse fM2. In the memory cell at (row M, column 3), the first terminal of first MOS transistor M3 may be connected to the first terminal of efuse fM3. In the memory cell at (row M, column 4), the first terminal of first MOS transistor M4 may be connected to the first terminal of efuse fM4.

For a memory cell at an odd row in columns 1 or 3, the second terminal of the first MOS transistor may be the first terminal of the memory cell, and the second terminal of the efuse may be the second terminal of the memory cell. The first terminal of each memory cell in the same column may be connected together, and the second terminal of each memory cell in the same column may be connected together.

Specifically, in column 1, the second terminal of the first first MOS transistor 11, the second first MOS transistor 21, ..., and the $M^{th}$ first MOS transistor M1 may be connected together; and the second terminal of the first efuse f11, the second efuse f21, ..., and $M^{th}$ efuse fM1 may be connected together. Similarly, in column 3, the second terminal of the first first MOS transistor 13, the second first MOS transistor 23, ..., and the $M^{th}$ first MOS transistor M3 may be connected; and the second terminal of the first efuse f13, the second efuse f23, ... and the $M^{th}$ efuse fM3 may be connected together.

For a memory cell at an even row in columns 2 or 4, the second terminal of the efuse may be the first terminal of the memory cell, and the second terminal of the first MOS transistor may be the second terminal of the memory cell. The first terminal of each memory cell in the same column may be connected, and the second terminal of each memory cell in the same column may be connected.

Specifically, in column 2, the second terminal of the first efuse f12, the second efuse f11, ..., and the $M^{th}$ efuse fM2 may be connected together, and the second terminal of the first first MOS transistor 12, the second first MOS transistor 22, ..., and the $M^{th}$ first MOS transistor M2 may be connected together. Similarly, in column 4, the second terminal of the first efuse f14, the second efuse f24, ... and the $M^{th}$ efuse fM4 may be connected together; and the second terminal of the first first MOS transistor 14, the second first MOS transistor 24, ..., and the $M^{th}$ first MOS transistor M4 may be connected together.

The second terminal of each memory cell of column 1 may be connected to the first terminal of each memory cell of column 2; the second terminal of each memory cell of column 2 may be connected to the first terminal of each memory cell of column 3; and the second terminal of each memory cell of column 3 may be connected to the first terminal of each memory cell of column 4.

Figure 3:
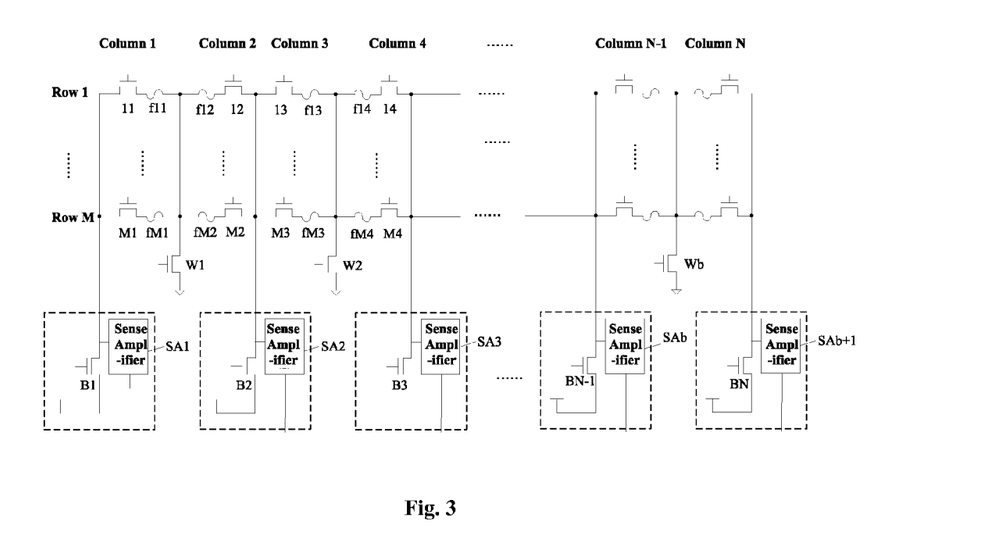
FIG. 3 illustrates an exemplary memory device consistent with the disclosed embodiments.

As shown in FIG. 3, the present disclosure provides a memory device. The memory device includes the memory array described above, at least one second MOS transistor, at least one sense amplifier, and at least one third MOS transistor. The first terminal of the first second MOS transistor may be connected to the input terminal of the first sense amplifier and the first terminal of each memory cell of column 1; and the first terminal of the $j^{th}$ second MOS transistor may be connected to the input terminal of the $j^{th}$ sense amplifier and the second terminal of each memory cell of column $(2j-2)$, where $j≥2$. The first terminal of the $k^{th}$ third MOS transistor may be connected to the second terminal of each memory cell of column $(2k-1)$, where $k≥1$.

Specifically, the second MOS transistors may include a first second MOS transistor B1, a second second MOS transistor B2, a third second MOS transistor B3, a fourth second MOS transistor B4, ..., an $(N-1)^{th}$ second MOS transistor (BN-1), and an $N^{th}$ second MOS transistor BN.

The sense amplifiers may include a first sense amplifier SA1, a second sense amplifier SA2, a third sense amplifier SA3, a fourth sense amplifier SA4, ..., a $b^{th}$ sense amplifier SAb, and a $(b+1)^{th}$ sense amplifier SA(b+1), where b≥1. When N is an even number, b=N/2; and when N is an odd number, b=(N+1)/2.

The third MOS transistors may include a first third MOS transistor W1, a second third MOS transistor W2, ..., and a $b^{th}$ third MOS transistor Wb.

The disclosed memory device may include (b+1) sense amplifiers. When N, the number of columns, is an even number, b=N/2; and when N is an odd number, b=(N+1)/2. That is, the number of sense amplifier used in the memory device may be (N/2+1) or ((N+1)/2+1), where N is often a large positive integer. Compared to the existing efuse technology, where one sense amplifier is used for each column (i.e., N sense amplifiers for N columns), the number of sense amplifier used in the disclosed memory device is greatly reduced.

In one embodiment, the first terminal of the second MOS transistor may be the drain of the second MOS transistor, and the second terminal of the second MOS transistor may be the source of the second MOS transistor. Alternatively, the first terminal of the second MOS transistor may be the source of the second MOS transistor, and the second terminal of the second MOS transistor may be the drain of the second transistor. The first terminal of the third MOS transistor may be the drain of the third transistor, and the second terminal of third MOS transistor may be the source of the third transistor. Alternatively, the first terminal of the third MOS transistor may be the source of the third transistor, and the second terminal of third MOS transistor may be the drain of the third transistor.

Structure of the memory device will be further illustrated by using the memory cells of columns 1 to 4.

The first terminal of the first second MOS transistor B1 may be connected to the input terminal of the first sense amplifier SA1 and the second terminal of each first MOS transistor in column 1. The first MOS transistors in column 1 may include the first first MOS transistor 11, the second first MOS transistor 12, ..., and the $M^{th}$ first MOS transistor M1.

The first terminal of the second second MOS transistor B2 may be connected to the input terminal of the second sense amplifier SA2 and the second terminal of each first MOS transistor in column 2 and the second terminal of each first MOS transistor of column 3. The first MOS transistors in column 2 may include the first first MOS transistor 12, the second first MOS transistor 22, ..., and the $M^{th}$ first MOS transistor M2. The first MOS transistors in column 2 may include the first first MOS transistor 13, the second first MOS transistor 23, ..., and the $M^{th}$ first MOS transistor M3.

The first terminal of the third second MOS transistor B3 may be connected to the input terminal of the third sense amplifier SA3 and the second terminal of each first MOS transistor of column 4. The first MOS transistors in column 4 may include the first first MOS transistor 14, the second first MOS transistor 24, ..., and the $M^{th}$ first MOS transistor M4.

The first terminal of the first third MOS transistor W1 may be connected to the second terminal of each efuse of column 1 and the second terminal of each efuse of column 2. The efuses of column 1 may include the first efuse f11, . . . , and the $M^{th}$ efuse fM1. The efuses of column 2 may include the first efuse f12, . . . , and the $M^{th}$ efuse fM2.

The first terminal of the second third MOS transistor W2 may be connected to the second terminal of each efuse of column 3 and the second terminal of each efuse of column 4. The efuses of column 3 may include the first efuse f13, . . . , and the $M^{th}$ efuse fM3. The efuses in column 4 may include the first efuse f14, . . . , and the $M^{th}$ efuse fM4.

In this disclosure, writing data for a memory cell or column may refer to the data to be programmed into the memory cell or column. A programming/programming memory cell or column may refer to a memory cell or column to be programmed/written or is programmed with the corresponding writing data. A not-programming memory cell or column may refer to a memory cell or column not to be programmed/written nor is programmed with the corresponding writing data.

The present disclosure provides a programming method for the memory device described above. The programming method may include forming a path connecting the writing memory cell, the second MOS transistor connected to the programming memory cell, and the third MOS transistor connected to the programming memory cell to program writing data to the programming memory cell.

In one embodiment, the second MOS transistor connected to the programming memory cell may be the second MOS transistor connected directly to the first MOS transistor of the programming memory cell. The third MOS transistor connected to the programming memory cell may be the third MOS transistor connected directly to the efuse of the programming memory cell. The sense amplifier connected to the programming memory cell may be the sense amplifier connected directly to the first MOS transistor of the programming memory cell.

Figure 4:
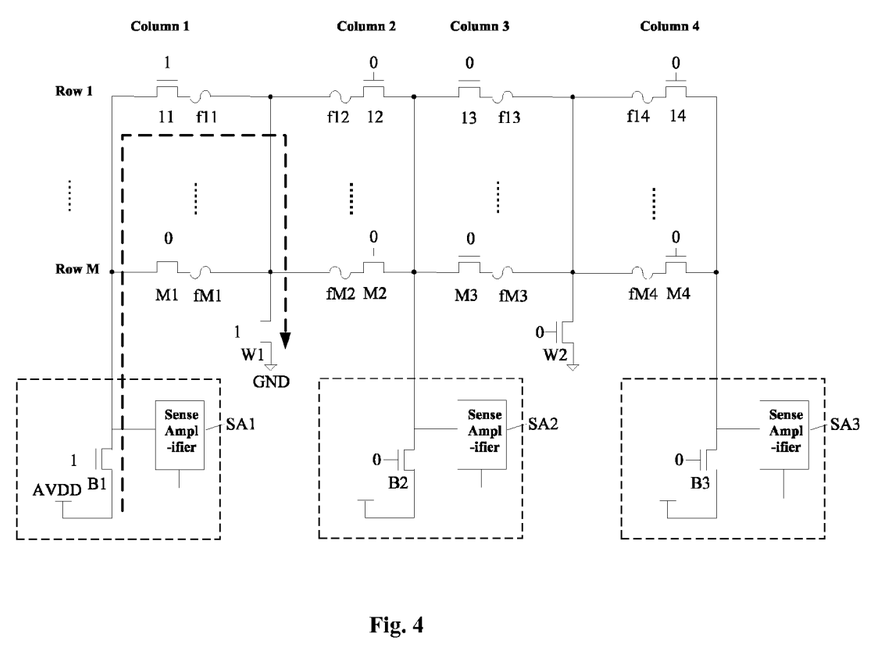
FIG. 4 illustrates an exemplary programming process for the memory device consistent with the disclosed embodiments.

As shown in FIG. 4, assuming, for example, the memory cell at (row 1, column 1) is a programming memory cell, the second MOS transistor connected to the programming memory cell may be second MOS transistor B1 connected to the programming memory cell at (row 1, column 1), and the third MOS transistor connected to the programming memory cell may be third MOS transistor W1 connected to the programming memory cell at (row 1, column 1).

The path connecting the programming memory cell, the second MOS transistor connected to the programming memory cell, and third MOS transistors connected to the programming memory cell may be the electric path connecting the first MOS transistor of the programming memory cell, the efuse of the programming memory cell, second MOS transistor connected to the programming memory cell, and third MOS transistor connected to the programming memory cell to allow electric current to flow through.

Specifically, to form the path described in the programming method for the memory device, the first MOS transistor of the programming memory cell, the second MOS transistor connected to the programming memory cell, and the third MOS transistors connected to the programming memory cell may be turned on. In order to turn on first MOS transistor 11, second MOS transistor B1, and third MOS transistor W1, a high voltage (e.g., power supply voltage VDD), may be applied on the gate of each of the transistors. In one embodiment, "1" may represent a high voltage, and "0" may represent a low voltage.

Further, to write/program the writing data into the programming memory cell, a first voltage may be applied on the second terminal of the second MOS transistor connected to the programming memory cell, and a second voltage may be applied on the second terminal of third MOS transistor connected to the programming memory cell. The first voltage is not equal to the second voltage.

As shown in FIG. 4, applying different voltages on the second terminal of the second MOS transistor and the second terminal of the third MOS transistor can melt the efuse of the programming memory cell. Thus, the difference between the first voltage and the second voltage may be determined by the intensity of the electric current required for melting the efuse.

Specifically, a programming voltage AVDD may be applied on the second terminal of second MOS transistor B1, and ground voltage GND may be applied on the second terminal of third MOS transistor W1. Because first MOS transistor 11, second MOS transistor B1, and third MOS transistor W1 are turned on, electric current can flow from the second terminal of second MOS transistor B1, through the efuse f11, and to the second terminal of third MOS transistor W1. By controlling the intensity and on-time of the electric current, efuse f11 may be melted such that the memory cell at (row 1, column 1) may be programmed.

Figure 5:
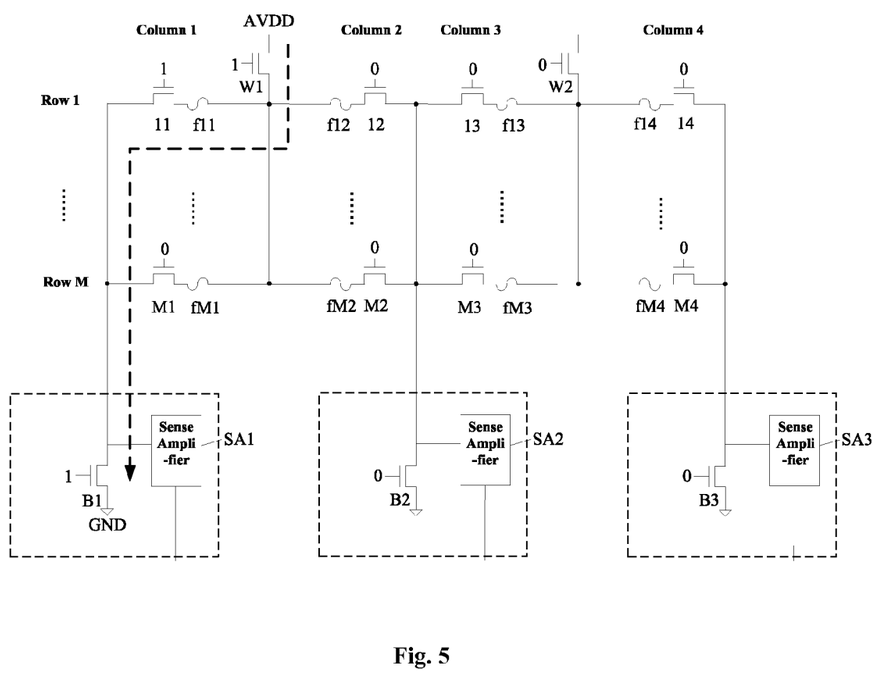
FIG. 5 illustrates another programming process for the memory device consistent with the disclosed embodiments.

Similarly, as illustrated in FIG. 5, by applying ground voltage GND on the second terminal of second MOS transistor B1, and applying the programming voltage AVDD on the second terminal of third MOS transistor W1, electric current can flow from the second terminal of third MOS transistor W1, through the efuse f11, and to the second terminal of second MOS transistor B1 such that the memory cell at (row 1, column 1) may be programmed.

When programming a programming memory cell, the first MOS transistors of the not-programming memory cells may be turned off. The not-programming memory cells may refer to the memory cells other than the programming memory cell. For example, when the memory cell at (row 1, column 1) is the programming memory cell, all the memory cells other than the memory cell at (row 1, column 1) may be not-programming memory cells. By applying a low voltage "0" on the gate of the first MOS transistor of each not-programming memory cell, such as, ground voltage, the first MOS transistor of each not-programming memory cell may be turned off.

In some embodiments, to confine the electric current flow of the path as shown in FIG. 4, the sense amplifier connected to the programming memory cell may be disabled, and the second MOS transistors not connected to the programming memory cell may be turned off. The third MOS transistors not connected to the writing memory cell may be turned off, and the sense amplifiers not connected to the writing memory cell may be disabled, where the sense amplifiers may be disabled by sending/applying a "disable" signal to each of the sense amplifier.

The present disclosure further provides a non-redundant reading method for the memory device. The non-redundant reading method may include forming a path connecting the reading memory cell, the sense amplifier connected to the reading memory cell, and the third MOS transistor connected to the reading memory cell to read data from the reading memory cell.

In this disclosure, the reading data of a memory cell or column may refer to the data to be read or is read from the memory cell or column, and a reading memory cell or column may refer to a memory cell or column to be read or is read such that the data stored in the reading memory cell or column can be accessed. A not-reading memory cell or column may refer to a memory cell or column not to be read nor is read.

The path connecting the reading memory cell, the sense amplifier connected to the reading memory cell, and the third MOS transistor connected to the reading memory cell may be the electric path connecting the first MOS transistor of the reading memory cell, the efuse of the reading memory cell, the third MOS transistor connected to the reading memory cell, and the sense amplifier connected to the reading memory cell.

Specifically, to form the path for the non-redundant reading method, the first MOS transistor of the reading memory cell and the third MOS transistor connected to the reading memory cell may be turned on, and the sense amplifier connected to the reading memory cell may be enabled.

The first MOS transistor and the third MOS transistor may be turned on by applying a high voltage "1" on the gate of the first MOS transistor and on the gate of the third transistor. The second MOS transistor may be turned off by applying a low voltage "0" on the gate of the second MOS transistor. The sense amplifier may be enabled by sending an "enable" signal to the sense amplifier.

When reading data from the reading memory cell, power supply voltage or ground voltage may be applied on the second terminal of the third MOS transistor connected to the reading memory cell.

Figure 6:
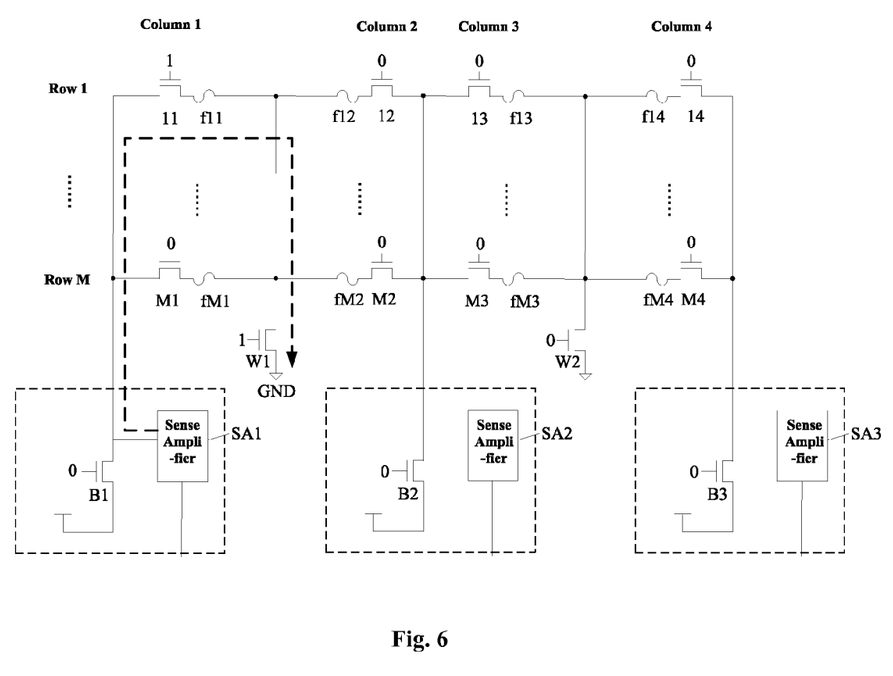
FIG. 6 illustrates an exemplary non-redundant reading process for the memory device consistent with the disclosed embodiments.

As illustrated in FIG. 6, for example, the memory cell at (row 1, column 1) is the reading memory cell. The third MOS transistor connected to the reading memory cell may be third MOS transistor W1 connected to the memory cell at (row 1, column 1); the sense amplifier connected to the reading memory cell may be sense amplifier SA1 connected to the memory cell at (row 1, column 1); and the second MOS transistor connected to the reading memory cell may be second MOS transistor B1 connected to the memory cell at (row 1, column 1). By applying ground voltage GND on the second terminal of third MOS transistor W1, the enabled sense amplifier SA1 may generate a sensing current, send the sensing current to the memory cell, and amplify the sensed voltage to a recognizable logic level.

Figure 7:
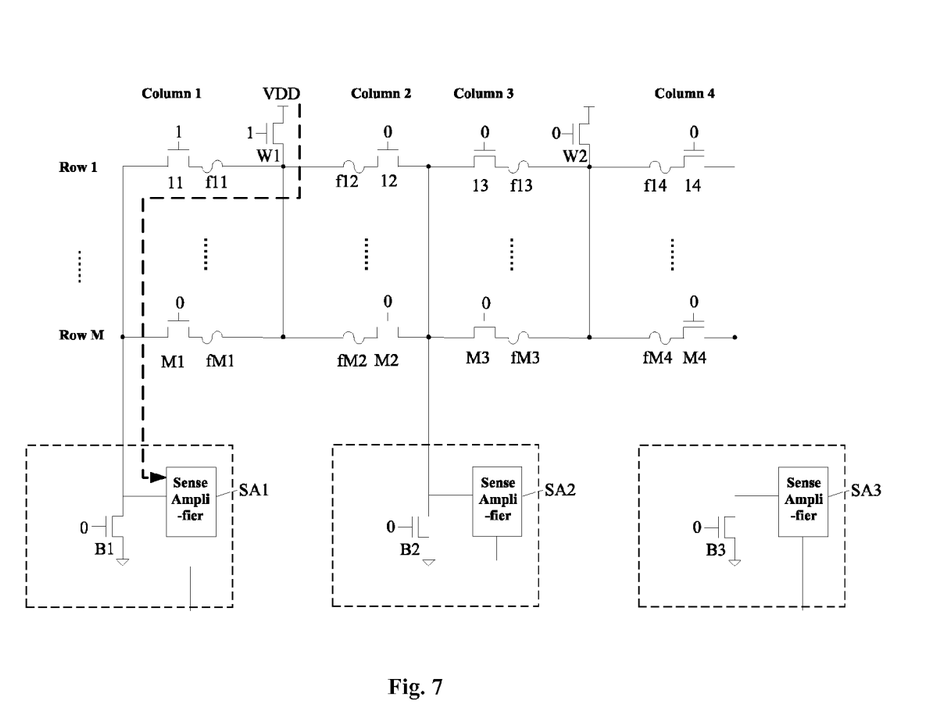
FIG. 7 illustrates another exemplary non-redundant reading process for the memory device consistent with the disclosed embodiments.

Similarly, as shown in FIG. 7, when applying power supply voltage VDD on the second terminal of third MOS transistor W1, the enabled sense amplifier SA1 may receive a sensing current, and amplify the sensed voltage to a recognizable logic level representing the data stored in the memory cell being read. The working principles of the sense amplifier described above are known to those skilled in the art and are thus omitted herein.

When reading data from the reading memory cell, the first MOS transistor of each of the not-reading memory cell may be turned off. The not-reading memory cells may be the memory cells other than the reading memory cell.

In some embodiments, to confine the electric current of the path for the non-redundant reading method as shown in FIGS. 6 and 7, the second MOS transistor connected to the reading memory cell may be turned off, the sense amplifiers not connected to the reading memory cell may be turned off, the second MOS transistors not connected to the reading memory cell may be turned off, and/or the third MOS transistors not connected to the reading memory cell may be turned off.

When "1" is to be programmed to a memory cell, the disclosed programming method may be used to write "1" into the memory cell. However, if during the programming process, the current intensity is not sufficiently high, or the current on-time is not sufficiently long, the efuse may not be successfully melted, leading to a failed programming process or programming failure. To test if a programming failure has occurred, non-redundant reading may be used after programming of the memory cell. If the efuse is not melted, the reading of the sense amplifier may be "0"; and if the efuse is melted, the reading of the sense amplifier may be "1". If the data programmed to the memory cell is different from the data read from the memory cell, the programming of the memory cell failed or a programming failure occur has occurred.

To solve the problems caused by programming failures, embodiments of the present disclosure provide an operation method for the memory device. In the operation method, first, the memory cells of column (p+c) may be selected as the redundant memory cells for memory cells of column p (represented by "a redundant column p"), where p≥1, c≥1. Further, the writing data for column p may be programmed into the redundant column p.

Column p may be any column in the memory array/device. The redundant column p may be one column other than column p with a higher column number. A redundant column p may be configured to provide accurate reading results even after programming failures occur when programming column p. Specifically, in various embodiments, each memory cell in column p may correspond to one memory cell in the same row in a redundant column p. Each memory cell in redundant column p may be referred as the redundant memory cell for the corresponding memory cell in column p.

For a column p, one or more redundant columns can be selected to store redundant data (e.g., writing data for column p) corresponding to column p. Together, the one or more redundant columns can be referred as "the redundant columns for column p". In this case, arranged by the column number from low to high, each of the redundant columns for column p may be referred as a first redundant column p (i.e., the first column of the redundant columns for column p), a second redundant column p (i.e., the second column of the redundant columns for column p), and so on.

When the programming of columns p to (p+c−1) fails using the writing data for column p, column (p+c) may be selected as a redundant column p, where p≥1, c≥1.

For example, to test/determine if the programming of column p fails, memory cells from (row 1, column p) to (row M, column p) may be selected as the reading memory cells. A path may be formed to connect the reading memory cell, the sense amplifier connected to the reading memory cell, and the third MOS transistor connected to the reading memory cell to read data. When the writing data for the reading memory cells differs from the data read from the reading memory cells, the programming of column p fails. When the writing data for the reading memory cells is the same as the data read from the reading memory cells, the programming of column p is successful, (i.e., the data programmed to the memory cells is the writing data for the memory cells). The testing of programming failure may be performed after programming the entire column, or after programming each memory cell.

If the programming of column p is successful using the writing data for column p, writing data for column (p+1) can be programmed to column (p+1). The writing data for column (p+1) may be the data to be programmed to column (p+1), same or different from the writing data for column p.

Assuming, for example, a memory device includes a 6 row by 2 column memory array. The writing data for column 1 may be "101010"; and the writing data for column 2 may be "111100". By using the disclosed programming method, each bit of "101010" may be programmed to the corresponding memory cell in column 1.

After the programming process, the writing data programmed to column 1 may be read out by using the disclosed non-redundant reading method. The writing data for column 1 may be "101010". If the data is read as "001010", different from "101010", the programming of column 1 fails. Further, after programming data to column p is tested/determined to be failed, column 2 may be selected as the first column of redundant columns for column 1 (i.e., the first redundant column 1), and "101010", the writing data for column 1, may be programmed into the first redundant column 1 by using the disclosed programming method.

Because column 2 is already selected as a redundant column for column 1, the initial column 3 may then be column 2. Accordingly, when programming column 3, the writing data for the initial column 2 can be programmed to the initial column 3, and so on.

After the programming process, data programmed to column 1 may be read out by using the disclosed non-redundant reading method. If the data is read as "101010", same as "101010" (i.e., the writing data for column 1), the programming of column 1 is successful. After the programming of column 1 is tested to be successful, "111100", the writing data for column 2, may be programmed to column 2 by using the disclosed programming method.

However, when programming data to redundant memory cells/columns, programming failure may also occur. To test if the programming of redundant memory cells/columns fails, memory cells from (row 1, column p) to (row M, column p) may be selected consecutively as the reading memory cells. That is, data stored in each memory cell of column p may be read out consecutively. Further, a path connecting the reading memory cell, the memory cells from columns (p+1) to (p+q) that are in the same row as the reading memory cell, the second MOS transistor connected to the reading memory cell, and the sense amplifier connected to column (p+q) may be formed to read data, where $1 \geq q \geq c-1$, c is an odd number and q is an odd number. If the data read from the reading memory cell differs from the writing data for the reading memory cell, the programming of column (p+q) fails. In one embodiment, column (p+q), i.e., the redundant column p, may be an even-numbered column in the memory array/device.

The path connecting the reading memory cell, the memory cells from column (p+1) to (p+q) that are in the same row as the reading memory cell, the second MOS transistor connected to the reading memory cell, and the sense amplifier connected to column (p+q) may be the electric path connecting the first MOS transistor and the efuse of the reading memory cell, the first MOS transistor and efuse of each memory cell from columns (p+1) to (p+q) that are in the same row as the reading memory cell, the second MOS transistor connected to the memory cell, and the sense amplifier connected to column (p+q) to allow electric current to flow through.

A redundant reading memory cell may be a memory cell in a redundant column p, and the redundant reading memory cell may be in the same row as the corresponding reading memory cell in column p. Column p may correspond to one or more redundant columns. The first redundant column p may be the first redundant column located next to column p, and the last redundant column p may be located at a farthest position from the first redundant column p.

The above steps for testing redundant memory cells may be implemented by using the redundant reading method for the memory device. In the redundant reading method, a path connecting the reading memory cell in column p, the redundant reading memory cells in redundant columns for column p, the second MOS transistor connected to column p, and the sense amplifier connected to the last column of redundant columns for column p may be formed to read data, where pal.

To form the path connecting the reading memory cell in column p, the redundant reading memory cells in redundant columns for column p, the second MOS transistor connected to column p, and the sense amplifier connected to the last redundant column p, the first MOS transistor of the reading memory cell in column p may be turned on, the first MOS transistors of the redundant reading memory cells in the redundant columns for column p may be turned on, and the second MOS transistor connected to column p may be turned on. Further, the sense amplifier connected to the last redundant column p may be enabled.

Meanwhile, to confine electric current flow of the path as described above, the second MOS transistor and the third MOS transistor connected to redundant columns for column p can be turned off, the sense amplifier connected to column p may be disabled, the first MOS transistor of each of the no-reading memory cell may be turned off, the sense amplifiers not connected to either column p or redundant columns for column p may be disabled, the second MOS transistors not connected to either column p or redundant columns for column p may be turned off, and/or the third MOS transistors not connected to either column p or redundant columns for column p may be turned off.

It should be noted that, the sense amplifier connected to column p can also be used to test if a programming process fails. Specifically, memory cells from (row 1, column p) to (row M, column p) may be selected consecutively as the reading memory cells. Further, a path connecting the reading memory cells, memory cells from columns (p+1) to (p+q) that are in the same row as the reading memory cell, the third MOS transistor connected to column (p+q), and the sense amplifier connected to column p may be formed to read data. If the data read from the column (p+q) differs from the writing data for column p, the programming of column (p+q) fails. In one embodiment, column (p+q), i.e., a redundant column p, may be an even-numbered column in the memory array.

Corresponding to the above testing method using the sense amplifier connected to column p, in the redundant reading method, a path connecting the reading memory cell in column p, the redundant reading memory cells in redundant columns for column p, the second MOS transistor connected to the last column of redundant columns for column p, and the sense amplifier connected to column p may be formed to read data, where $p \geq 1$, $c \geq 1$, and c is an odd number.

To form the path connecting the reading memory cell in column p, the redundant reading memory cells in redundant columns for column p, the second MOS transistor connected to the last column of redundant columns for column p, and the sense amplifier connected to column p, the first MOS transistor of the reading memory cell in column p may be turned on, the first MOS transistor of the redundant reading memory cell in redundant column p may be turned on, and the second MOS transistor connected to the last column of redundant columns for column p may be turned on. Further, the sense amplifier connected to column p may be enabled.

To confine the electric current flow of the path, the second MOS transistor connected to column p and the third MOS transistor connected to column p may be turned off, the sense amplifier connected to redundant columns for column p may be disabled, the first MOS transistor of each no-reading memory cells may be turned off, the sense amplifiers not connected to either column p or redundant columns for column p may be disabled, the second MOS transistors not connected to either column p or redundant columns for column p may be turned off, and/or the third MOS transistors not connected to either column p or redundant columns for column p may be turned off.

When the redundant memory cell is in an odd-numbered column, memory cells of (row 1, column p) to (row M, column p) may be consecutively selected as the reading memory cells. Further, a path connecting the reading memory cell, memory cells from columns (p+1) to (p+q) that are in the same row as the reading memory cell, the third MOS transistor connected to column (p+q), and the sense amplifier connected to column p may be formed to read data, where 1≤q≤c−1, c is an even number and q is an even number. If the data read from column (p+q) differs from the writing data for column p, the programming data to column (p+q) fails. In one embodiment, column (p+q), i.e., a redundant column p, may be an odd-numbered column in the memory array.

Correspondingly, in the redundant reading method provided for the memory device, a path connecting the reading memory cell in column p, the redundant reading memory cells in redundant columns for column p, the third MOS transistor connected to the last column of redundant columns for column p, and the sense amplifier connected to column p may be formed to read data, where p≥1, c≥1, and c is an even number.

To form the path connecting the reading memory cell in column p, the redundant reading memory cells in redundant columns for column p, the third MOS transistor connected to the last redundant column p, and the sense amplifier connected to column p, the first MOS transistor of the reading memory cell in column p may be turned on, the first MOS transistors of the redundant reading memory cells in redundant columns for column p may be turned on, and the third MOS transistor connected to the last redundant column p may be turned on. Further, the sense amplifier connected to column p may be enabled.

To confine the electric current flow of the path, the second MOS transistor connected to column p and the third MOS transistor connected to column p may be turned off, the sense amplifiers connected to redundant columns for column p may be disabled, the first MOS transistor of each of the no-reading memory cell may be turned off, the sense amplifiers not connected to either column p or redundant column for column p may be disabled, the second MOS transistors not connected to either column p or redundant columns for column p may be turned off, and/or the third MOS transistors not connected to either column p or redundant columns for column p may be turned off.

In the redundant reading method described above, power supply voltage or ground voltage may be applied on the second terminal of the second MOS transistor or the second terminal of the third MOS transistor connected to the enabled sense amplifier. The ON/OFF state of the first MOS transistor, the second MOS transistor, and the third MOS transistor, and the enabling/disabling of the sense amplifier may be realized following the same working principles in previous embodiments.

Thus, in the disclosed memory array and memory device, the memory cell in a row of the memory array may be connected in series with the one or more of corresponding redundant memory cells in the same row. Only one programming success is required for a reading process to obtain an accurate reading result, so that replacement of the entire row after programming failure occurs is not needed. Manufacturing yield of the memory array/device can be greatly improved. Also, in certain other embodiments, the redundant memory cells and the corresponding memory cell may be arranged in separate memory arrays and operated independently. The redundant memory cells may be in the same row as the corresponding memory cell in the separate memory array/device. Details of the operation are similar to the disclosed embodiments and are thus omitted herein.

The non-redundant reading method and the method to determine if programming data to a redundant memory cell fails by using the non-redundant reading method can now be further illustrated using the embodiment below.

Figure 8:
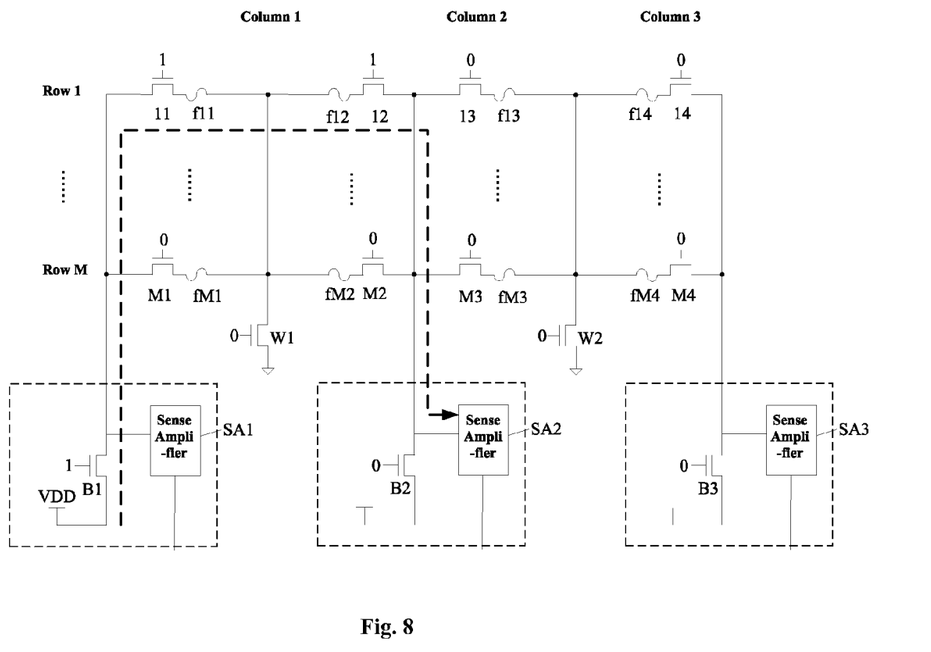
FIG. 8 illustrates an exemplary redundant reading process for the memory device consistent with the disclosed embodiments.

As illustrated in FIG. 8, assuming, for example, after the programming of column 1 fails, column 2 may be selected to be the first redundant column 1 (i.e., the first column of the redundant columns for column 1), and the writing data for column 1 may be programmed to the first redundant column 1. Efuse f12 and first MOS transistor 12 may be located in the first redundant column 1, and efuse f11 and first MOS transistor 11 may be located in column 1. Since the first redundant column 1 may be located next to column 1, the first redundant column 1 may thus be the first column of redundant columns for column 1.

Assuming, for example, the memory cell at (row 1, column 1) of the memory array/device is the reading memory cell. The corresponding redundant memory cell at row 1 of the first redundant column 1, same row as the reading memory cell, may be the corresponding redundant reading memory cell. A high voltage "1" may be applied on first MOS transistor 11 of the memory cell at (row 1, column 1) of the memory device/array and first MOS transistor 12 of the corresponding redundant memory cell at row 1 of the first redundant column 1. A high voltage "1" may be applied on second MOS transistor B1 connected to the memory cell at (row 1, column 1) of the memory device/array, and an enabling signal may be sent to the sense amplifier SA2 connected to the redundant memory cell at row 1 of the first redundant column 1. A low voltage "0" may be applied on second MOS transistor B2 and third MOS transistor W1 connected to the redundant memory cell at row 1 of the first redundant column 1.

When power supply voltage VDD is applied on the second terminal of second MOS transistor B1, electric current may flow from the second terminal of second MOS transistor B1 through efuse f11 of the memory cell at (row 1, column 1) of the memory device/array, efuse f12 of the redundant memory cell at row 1 of the first redundant column 1, and to sense amplifier SA2. Sense amplifier SA2 may read data based on the testing electric current and the voltage of the second terminal of first MOS transistor 12. If at least one of fi and f12 is melted, the reading of SA2 may become "1". Thus, when the writing data for column 1 is being programmed to column 1 and the first redundant column 1, only one successful programming is required for the correct data to be read out by using the redundant reading method.

For example, the memory device may include a 6-by-2 memory array. The writing data for column 1 may be "101010", and the writing data for column 2 may be "111100".

By using the disclosed programming method, "101010" may be programmed to column 1, and may be read out using the non-redundant reading method after the programming process. If the data is read as "001010", different from "101010" (i.e., the writing data for column ), the programming of column 1 fails.

After the programming of column 1 fails, column 2 may be selected as the first column of redundant columns for column 1, i.e., the first redundant column 1. "101010" (i.e., the writing data for column 1) may be programmed to the first redundant column 1.

Assuming, for example, the data read from column 1 and the data read from the first redundant column 1 using the disclosed redundant reading method both provides "101010", same as "101010" (the writing data for column 1), the programming of the first redundant column 1 (i.e., the first column of redundant columns for column 1) is successful. The readings show that the efuse of the memory cell at (row 1, column 1) may not be melted but the efuse of the redundant memory cell at row 1 of the first redundant column 1 may be melted. However, the sense amplifier SA2 may still receive a "1". Thus, the manufacturing yield of the memory device can be improved.

However, if the data read from column 1 and the data read from the first redundant column 1 using the redundant reading method still provides "001010", the programming of the first redundant column 1 fails, and the initial column 3 may be selected as the second column of redundant columns for column 1 for. By using the programming method provided in the embodiment, "101010" (i.e., the writing data for column 1) may be programmed to the second column of the redundant columns for column 1.

Figure 9:
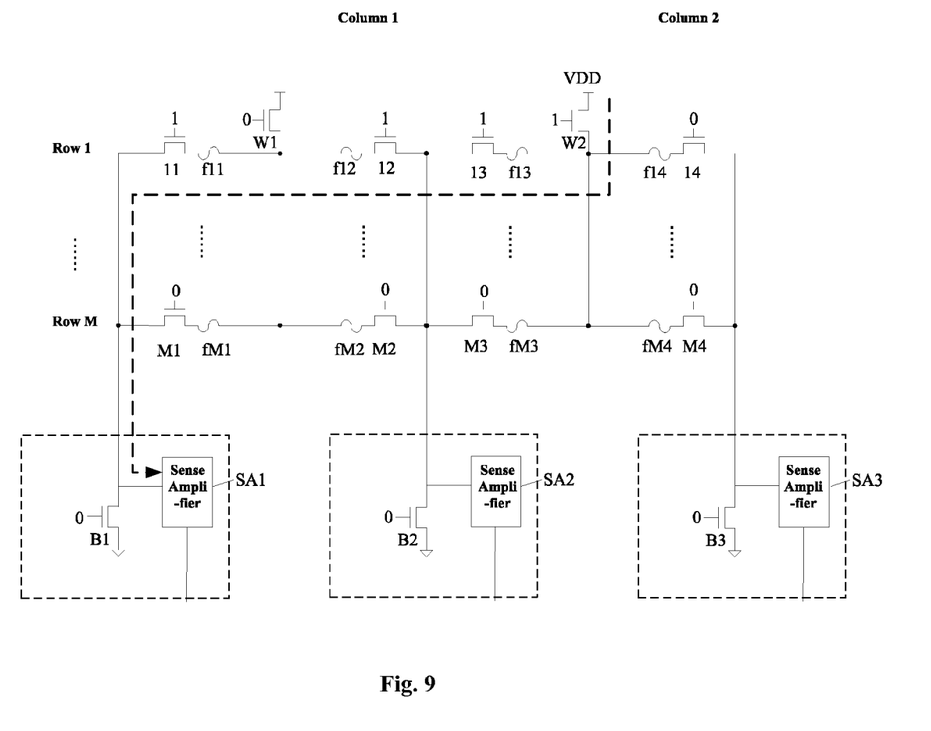
FIG. 9 illustrates another exemplary redundant reading process for the memory device consistent with the disclosed embodiments.

As illustrated in FIG. 9, when reading data from the memory cell at (row 1, column 1) and the redundant memory cell at row 1 of the first redundant column 1 by using the redundant reading method, a high voltage "1" may be applied on first MOS transistor 11 of the memory cell at (row 1, column 1) of the memory array/device and the first MOS transistor 12 of the redundant memory cell at row 1 of the first redundant column 1. A high voltage "1" may also be applied on the first MOS transistor 13 of the redundant memory cell in row 1 of the second redundant column 1.

First MOS transistor 11 and efuse f11 may be located in column 1. Because efuse f13 and first MOS transistor 13 may be located in the first redundant column 1, farthest away from column 1, efuse f13 and first MOS transistor 13 may be in the last column of the redundant columns for column 1. Thus, a high voltage "1" may be applied on the gate of third MOS transistor W2 connected directly to efuse f13, and an enabling signal may be sent to sense amplifier SA1 connected to the memory cell at (row 1, column 1) of the memory array/device. A low voltage "0" may be applied on the second MOS transistor B1 connected to the memory cell at (row 1, column 1) and third MOS transistor W1 connected to the memory cell at (row 1, column 1). Also, power supply voltage VDD may be applied on the second terminal of third MOS transistor W2, and electric current can flow from the second terminal of third MOS transistor W2, through efuse f13, efuse f12, efuse f11, to sense amplifier SA1.

Further, memory cells from row 2 to row M of column 1 may be selected consecutively as the reading memory cells, and the redundant reading method described above may be used to read data from each memory cell. If the data is read as "101010", same as "101010" (i.e., the writing data for column 1), the programming of the second redundant column 1 is successful.

Thus, the present disclosure provides an improved memory array and memory device structure. By using the programming, operation, non-redundant reading method, and redundant reading method provided in the disclosure, accurate data may be accessed even after the programming to the memory array/device fails. This can improve the manufacturing yield of the memory device and simplify the structure of the memory array/device.

Other applications, advantages, alterations, modifications, or equivalents to the disclosed embodiments are obvious to those skilled in the art.

What is claimed is:

1. A memory device, comprising:
   a memory, including an array of memory cells arranged as a plurality of rows by a plurality of columns, each memory cell including a first MOS transistor and an efuse,
   a plurality of second MOS transistors,
   a plurality of sense amplifiers, and
   a plurality of third MOS transistors, wherein:
   in a memory cell, a first terminal of the first MOS transistor is connected to a first terminal of the efuse, one of a second terminal of the first MOS transistor and a second terminal of the efuse is a first terminal of the memory cell, and another of a second terminal of the first MOS transistor and a second terminal of the efuse is a second terminal of the memory cell;
   a first terminal of the second MOS transistor is connected to an input terminal of a sense amplifier and the first terminals of memory cells in one column, and a first terminal of a $j^{th}$ second MOS transistor is connected to an input terminal of a $j^{th}$ sense amplifier and second terminals of memory cells in column ($2j-2$), wherein j is greater than 1; and
   a first terminal of a $k^{th}$ third MOS transistor is connected to second terminals of memory cells in column ($2k-1$), wherein k is an integer greater than 0.

2. The memory device according to claim 1, wherein the memory includes N columns and (N+1)/2 sense amplifiers with N being an odd number, or N columns and (N+1) sense amplifiers with N being an even number.

3. The memory device according to claim 1, wherein:
   a memory cell is connected to at least one redundant memory cell in series in a same row for storing same data as the memory cell; and
   a column of memory cells correspond to at least one redundant column of redundant memory cells wherein each redundant memory cell in the at least one redundant column stores same data as the memory cell in a same row.

4. The memory device according to claim 1, wherein:
   first terminals of memory cells in a column are connected to second terminals of memory cells in a lower column, and second terminals of memory cells in the column are connected to first terminals memory cells in a higher column.

5. A programming method for programming a memory device, the method comprising:
   providing the memory device comprising:
   a memory, including an array of memory cells arranged as a plurality of rows by a plurality of columns, each memory cell including a first MOS transistor and an efuse,
   a plurality of second MOS transistors,
   a plurality of sense amplifiers, and
   a plurality of third MOS transistors, wherein:
   a first terminal of the first MOS transistor is connected to a first terminal of the efuse, one of a second terminal of the first MOS transistor and a second terminal of the efuse is a first terminal of the memory cell, and another of a second terminal of the first MOS transistor and a second terminal of the efuse is a second terminal of the memory cell;

a first terminal of the second MOS transistor is connected to an input terminal of a sense amplifier and the first terminals of memory cells in one column, and a first terminal of a $j^{th}$ second MOS transistor is connected to an input terminal of a $j^{th}$ sense amplifier and second terminals of memory cells in column ($2j$–2), wherein j is greater than 1; and a first terminal of a $k^{th}$ third MOS transistor is connected to second terminals of memory cells in column ($2k$–1), wherein k is an integer greater than 0;

forming a path connecting a memory cell, a second MOS transistor connected to the memory cell, and a third MOS transistor connected to the memory cell; and programming data to the memory cell.

6. The programming method according to claim 5, further including:

applying a first voltage on a second terminal of the second MOS transistor; and applying a second voltage on a second terminal of the third MOS transistor, wherein the first voltage is different from the second voltage.

7. The programming method according to claim 5, further including one of more of:

disabling the sense amplifier connected to the memory cell, turning off a first MOS transistor of each memory cell not to be written, turning off second MOS transistors not connected to the memory cell, turning off third MOS transistors not connected to the memory cell, and disabling sense amplifiers not connected to the writing memory cell.

* * * * *